United States Patent
Edwards et al.

(10) Patent No.: US 9,329,237 B2
(45) Date of Patent: May 3, 2016

(54) SWITCH DETECTION DEVICE AND METHOD OF USE

(71) Applicant: Freescale Semiconductor, Inc., Austin, TX (US)

(72) Inventors: William E. Edwards, Ann Arbor, MI (US); Anthony F. Andresen, Chandler, AZ (US); Randall C. Gray, Tempe, AZ (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 143 days.

(21) Appl. No.: 14/152,262

(22) Filed: Jan. 10, 2014

(65) Prior Publication Data

US 2015/0198666 A1 Jul. 16, 2015

(51) Int. Cl.
| | |
|---|---|
| *H01H 36/00* | (2006.01) |
| *H01H 19/18* | (2006.01) |
| *G01R 31/327* | (2006.01) |
| *H03K 17/18* | (2006.01) |

(52) U.S. Cl.
CPC .............. *G01R 31/327* (2013.01); *H03K 17/18* (2013.01)

(58) Field of Classification Search
CPC ..................... E05Y 2900/55; E05Y 2400/324; E05Y 2400/854; E05F 11/445; H01H 36/00; H01H 19/18
USPC ......... 324/415, 422, 647, 679; 307/10.1, 112, 307/113, 117
See application file for complete search history.

(56) References Cited

U.S. PATENT DOCUMENTS

| | | | |
|---|---|---|---|
| 4,823,021 A * | 4/1989 | Shimada et al. | 307/112 |
| 6,809,600 B2 | 10/2004 | Chang et al. | |
| 7,203,463 B2 | 4/2007 | Bahl et al. | |
| 7,996,811 B2 | 8/2011 | Hoberman et al. | |
| 2002/0078390 A1* | 6/2002 | Sumida | 713/320 |
| 2006/0255812 A1* | 11/2006 | Martin et al. | 324/609 |
| 2011/0057658 A1* | 3/2011 | Yugou et al. | 324/426 |
| 2014/0300208 A1* | 10/2014 | Yamamoto et al. | 307/113 |

FOREIGN PATENT DOCUMENTS

JP 2011-070309 * 7/2011 ................ G06F 1/32

OTHER PUBLICATIONS

Multiple Switch Detection Interface with Suppressed Wake-up and 32 mA Wetting Current; Rev 10.0, Aug. 2011; © Freescale Semiconductor, Inc.; 32 pgs.
MAXIM 24-Channel Automotive Switch Monitor—MAX13362; Rev 0; Feb. 2009; © Maxim Integrated Products; 14 pgs.

\* cited by examiner

*Primary Examiner* — Tung X Nguyen
*Assistant Examiner* — Neel Shah

(57) ABSTRACT

A method of switch detection is disclosed that comprises, enabling a low power mode on a switch detection device, activating a first detection circuit for detecting, at a first expiration of a first polling time interval, a first switch state of a first switch having a first priority level, the first switch state including one of a first open state and a first closed state, comparing the detected first switch state with a prior first switch state, and activating a second detection circuit for detecting, at a second expiration of a second polling time interval, a second switch state of a second switch having a second priority level, the second switch including one of a second open state and a second closed state, and the second polling time interval being greater than the first polling time interval, and the second priority level being different from the first priority level.

20 Claims, 3 Drawing Sheets

US 9,329,237 B2

SWITCH DETECTION DEVICE AND METHOD OF USE

FIELD OF THE DISCLOSURE

The present disclosure relates to methods and devices for switch detection.

BACKGROUND OF THE DISCLOSURE

Vehicles, such as cars and motorcycles, commonly include a plethora of switches. Each switch can serve as an input associated with a network that includes a detection circuit, a microcontroller, and an actuator. In some examples, the switch detection circuit has three primary functions: provide a wetting current to the switch contacts, monitoring the switch, and alerting the microcontroller of any change in switch state (i.e., open to closed or closed to open). By example, a window lift switch is depressed, sensed by a detection circuit that communicates to a microcontroller that enables an actuator to open or close the window. These systems must operate continuously, both when the engine is running and when the engine is off. During operation of the vehicle, energy is abundant. When the vehicle is not being used, it is still necessary to monitor switch states and it is advantageous to limit the current drain on the battery, because only a limited amount of energy (coulombs) is available before a vehicle battery is depleted and the vehicle will not start. To conserve energy during non-operation of the vehicle, under certain conditions the switch detection device is configured to enter a low power mode. When the switch detection device is in low power mode, the microcontroller unit shuts down most of its functions and the switch detection device ceases to continuously monitor the status of the switches. Instead, the switch detection device samples or polls switch states. Sampling rate is set by a polling timer. Current drain on the battery includes the wetting current or load current applied to the switch, and the quiescent current of the switch detection circuit necessary for its operation. When the timer reaches a predetermined time, the switch detection device activates and turns on internal current sources (wetting current) and comparators (switch detection) for a sampling period. Voltages detected at the input of the comparators are compared with a threshold voltage. At the end of the sampling period, the value output by the comparators is either a high or a low output, indicating the switches are closed or open. The closed/open state of the switches is compared with the previously recorded state to determine if a change in state has occurred. If a switch has changed state, then a signal is generated to wake up the microcontroller unit and the switch detection device begins to continuously monitor the switches again in normal mode.

DETAILED DESCRIPTION

As will be apparent from the further discussion provided below, at least some embodiments encompassed herein envision a switch detection device having various configurable parameters. The switch detection device provides numerous advantageous in the operation of a vehicle. More particularly, the switch detection device includes a low power mode (i.e., a reduced operating power mode) that provides several configurable parameters to assist with the reduction of quiescent current and load current (e.g., wetting current) while a vehicle is not being operated, thus reducing the composite current drain on the battery. Configuration features can include the selection of a range of unique threshold voltages ($V_t$) for detecting the state of switches in switch circuits (providing noise immunity) and selection from a range of output currents to be used to drive various switch circuits (e.g., charge associated capacitors). Additional features can include the ability to select which switch circuits to activate, and the use of multiple selectable polling time intervals (e.g., slow polling time interval, normal polling time interval, fast poling time interval, etc.) to allow for less frequent energizing of low priority detection circuits connected to the switch circuits. Additionally, high priority switches can be monitored without the use of additional integrated circuit devices. The use of unique threshold voltages allows for each connected switch to be configured to provide suitable noise immunity that is independent of the other switches. Further, the ability to select an output current from a range of currents allows for the device to accommodate switch circuits having an associated shunt capacitance that is very large, as well as very small.

Figure 1:
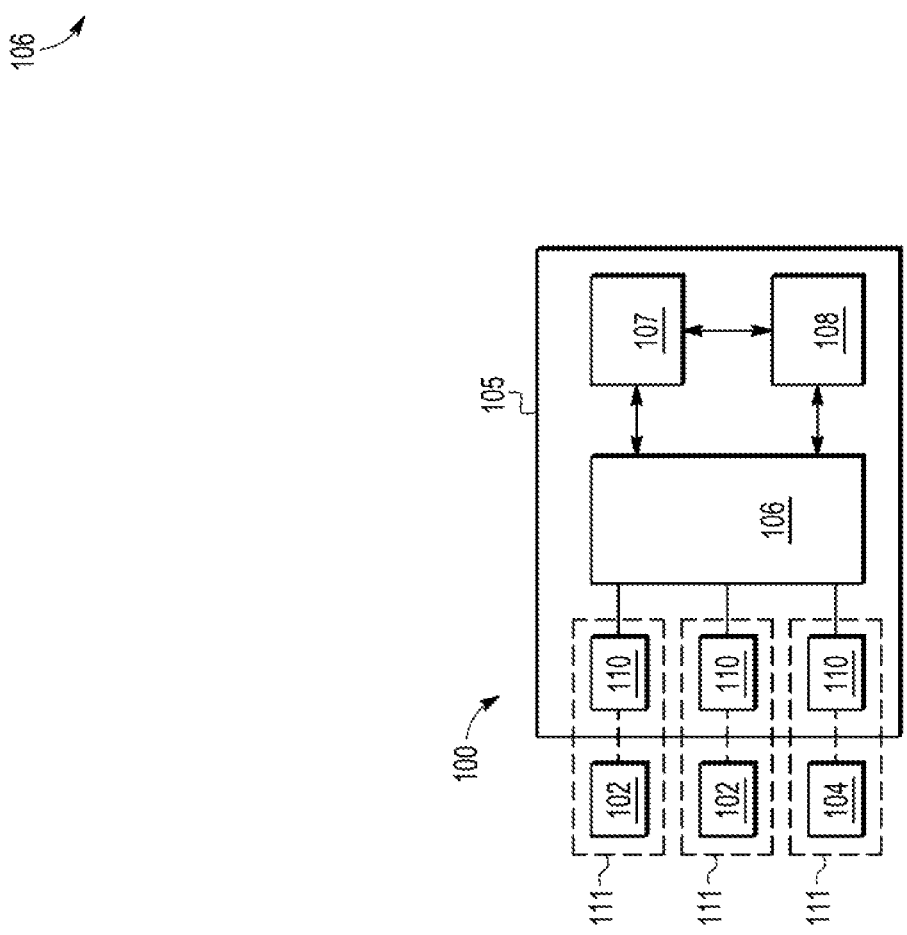
FIG. 1 is a block diagram of an exemplary switch detection system that, in accordance with an embodiment of the present disclosure, includes an exemplary switch detection device interconnected with various vehicle switches and sensors.

Referring to FIG. 1, a block diagram of an exemplary switch detection system 100 that, in accordance with an embodiment of the present disclosure, is interconnected with various vehicle switches 102 for detecting the state of a vehicle component, such as if a vehicle door is open or closed, if the windshield wipers have been turned on, etc. The switches 102 can include digital and analog switches/sensors, including semiconductor type switches, such as Field Effect Transistors, as well as discrete mechanical contact switches and sensors. In some embodiments, a switch 102 can be a sensor 104 that provides an independent voltage signal.

The system 100 can take a variety of forms, although in some embodiments, the system 100 includes a module 105 configured to receive and interface with a switch detection device 106. The module 105 includes a microcontroller unit 107, a power supply 108, and a plurality of shunt capacitors 110. In some embodiments, the switch detection device 106 is a separate component that is installable into the module 105, although in other embodiments, the switch detection device 106 can be integral to the module 105. For reference, in some embodiments, interconnection of the capacitors 110 of the module 105 with the switches 102 of the vehicle, form a plurality of switch circuits 111. The switch circuits 111 can include various additional components or interconnections associated with the module 105 and/or switches 102, such as resistors to limit electrostatic discharges in the circuit.

Figure 2:
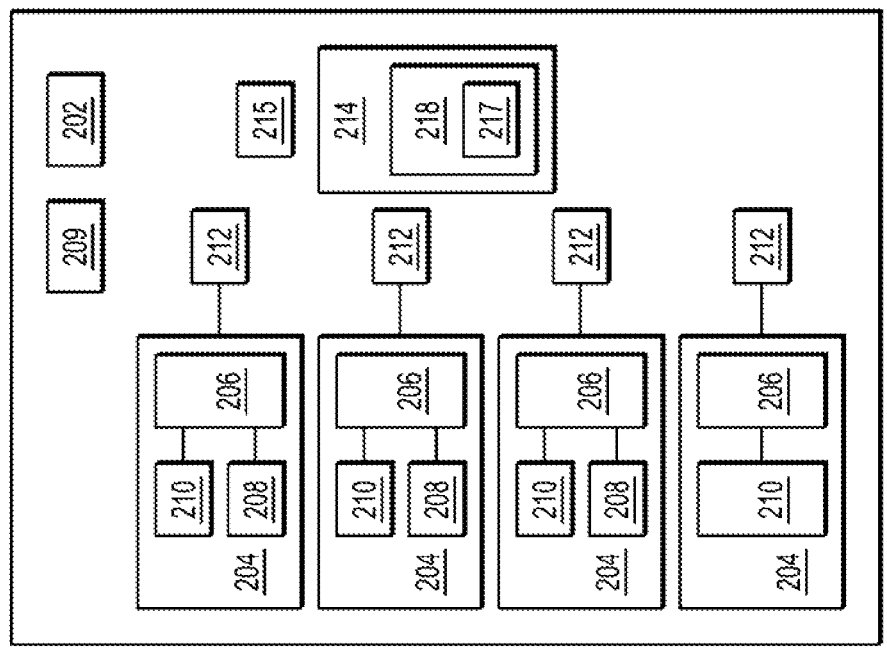
FIG. 2 is a block diagram of the exemplary switch detection device of FIG. 1.

Referring to FIG. 2, a block diagram of the switch detection device 106 is illustrated. In some embodiments, the switch detection device 106 is a mixed-use integrated circuit (IC), while in some embodiments, the switch detection device 106 can be another type of semiconductor device. The switch detection device 106 receives power at a power input port 202. In some embodiments, the switch detection device 106 is configured to receive about 13.5 volts of direct current voltage (DC voltage) from a power source, such as a battery typically installed in an automotive vehicle. Other voltages can also be received, for example, about 4.5 volts to about 36 volts of DC voltage. A plurality of detection circuits 204 are included in the switch detection device 106, wherein the detection circuits 204 further include, one or both of a detector 206 and a current source 208. The detection circuits 204 are configured for interconnection with the switch circuits 111. The switch detection device 106 further includes an internal clock 209 to identify various polling time intervals and scan times, as discussed below. The switch detection device 106 is configured to be connected to the microcontroller unit 107 via an interface control unit 214, such as a serial peripheral interface (SPI) and controller. The interface control unit 214 stores instructions for operating the various components of the switch detection device 106 and executes various functions using the data outputted from the detectors 206. The switch detection device 106 includes a wake output 215, which can be included within the interface control unit 214 or in communication therewith, to annunciate to one or both of the microcontroller unit 107 and the power supply 108 that the switch detection device 106 has changed from a low power state to a normal power state. The detectors 206 include respective detector inputs 210 and respective detector outputs 212. The detectors 206 are configured to compare voltages generated with the switch circuits 111, measured at the detector inputs 210, with pre-selected threshold voltages, and provide high or low digital outputs (1 or 0) at the detector outputs 212. In some embodiments, the detectors 206 are comparator devices, although other detecting devices can be utilized. The quantities of various components shown in FIGS. 1 and 2 are intended to be exemplary, and although fewer components can be provided, typically a larger quantity of the components, such as the detection circuits 204, are included to accommodate the available switches 102 typically found in a vehicle.

As discussed above, the switch detection device 106 includes a plurality of detection circuits 204 that are interconnected with switches 102 associated with a vehicle. When the vehicle is operational, ample current is available for operating the switch detection device 106, and this is considered normal power mode. In normal power mode, the switch detection device 106 continuously checks the status of the switches 102 using the detection circuits 204, recording their state and reporting any changes to the microcontroller unit 107. When the vehicle is non-operational, a vehicle battery 358 (FIG. 3) is not being charged, and therefore it is desirable to conserve energy to limit depletion of the battery 358. To reduce energy expended by the battery 358, the microcontroller unit 107, the power supply 108, and the switch detection device 106, can each enter low power mode, wherein the status of the switches 102 is checked periodically instead of continuously, such as at the expiration of one or more polling time intervals. If the state of one of the switches 102 changes, then the switch detection device 106 sends a wake command to the microcontroller unit 107 and/or the power supply 108, and they resume normal power mode. The switch detection device 106 provides a variety of detection circuit 204 configurations to accommodate various types of switches 102, for example, switch-to-ground and switch-to-battery configurations, discussed in detail below.

Figure 3:
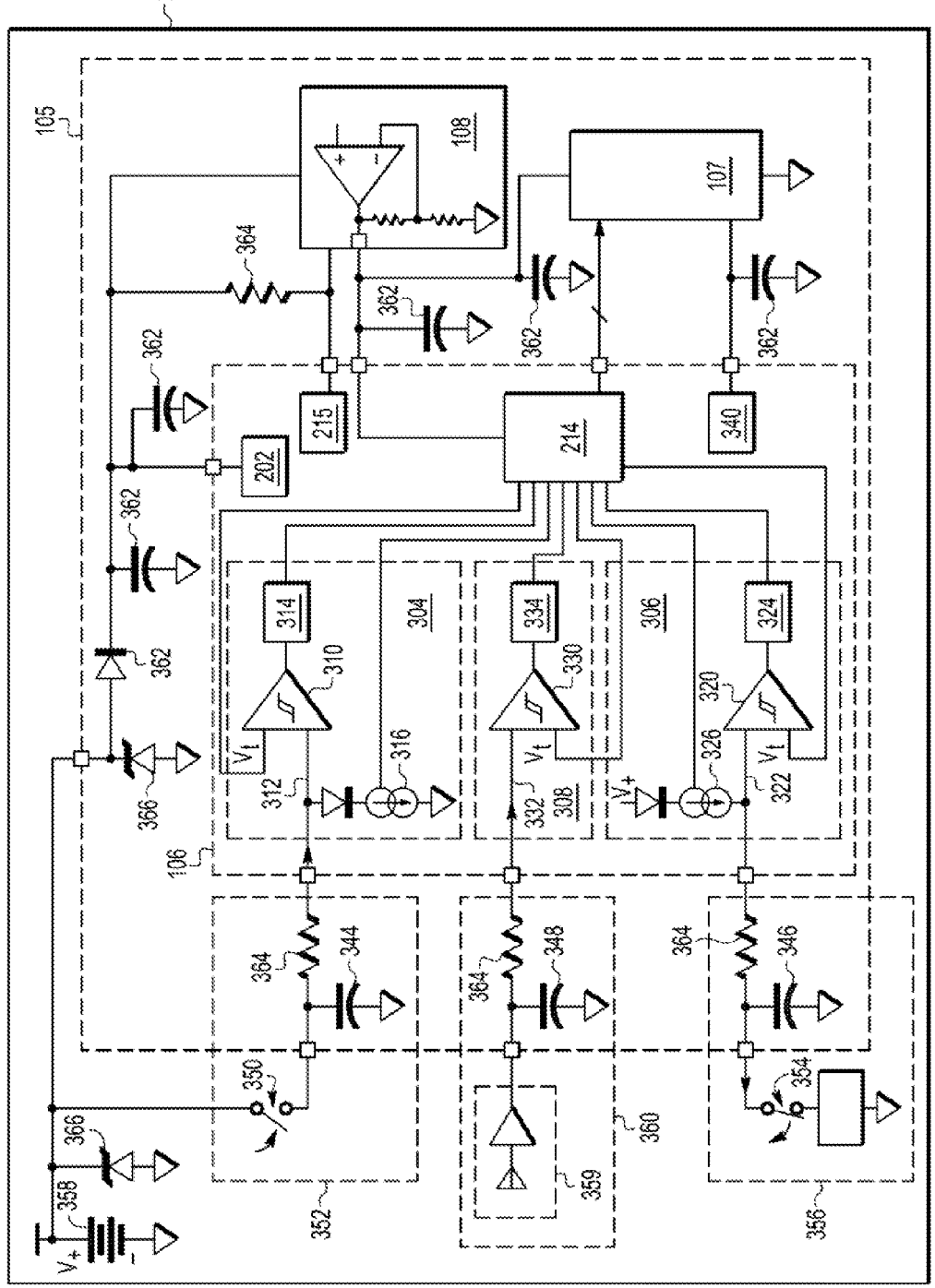
FIG. 3 is a schematic diagram of the switch detection system of FIG. 1, interconnected with various switch circuits.

Referring to FIG. 3, an exemplary schematic diagram of the switch detection system 100 is provided that illustrates the switch detection device 106 interconnected with various switches 102 of a vehicle 302. The switch detection device 106 includes the detection circuits 204 (FIG. 2) having current sources 208 (FIG. 2) and detectors 206 (FIG. 2). In at least some embodiments, and as shown in FIG. 3, the detection circuits 204 include a first detection circuit 304, a second detection circuit 306, and a third detection circuit 308. The first detection circuit 304 further includes a first detector 310 having a first detector input 312 and a first detector output 314. In addition, the first detection circuit 304 includes a first current source 316. The second detection circuit 306 further includes a second detector 320 having a second detector input 322 and a second detector output 324. Further, the second detection circuit 306 includes a second current source 326. The third detection circuit 308 also includes a third detector 330 having a third detector input 332 and a third detector output 334. In addition, the switch detection device 106 can also include an analog multiplexer 340 for reading inputs as analog.

Further referring to FIG. 3, in some embodiments the module 105 includes the capacitors 110 that are interconnected to the switches 102 to form various switch circuits 111. More particularly, as shown in FIG. 3, the capacitors 110 include a first capacitor 344, a second capacitor 346, and a third capacitor 348, and the switches 102 include a first switch 350, a second switch 354, and a sensor device 359. In addition, the switch circuits 111 (FIG. 1) include a first switch circuit 352, a second switch circuit 356, and a third switch circuit 360. The first capacitor 344 is shown connected to the first switch 350 as a shunt capacitor and forming the first switch circuit 352. The second capacitor 346 is shown connected to the second switch 354 as a shunt capacitor and forming the second switch circuit 356. The first switch 350 and second switch 354 can include one or more of various types of switches, including normally-closed and normally-open configurations. In some embodiments, the first switch 350 is identified as a low priority switch, such as a normally-open windshield wiper activation switch. The first switch 350 is shown configured to operate in a switch-to-battery circuit configuration. More particularly, the first switch 350 is connected to a positive side of the vehicle battery 358 at one end, and at the other end, to each of the first capacitor 344, the first current source 316, and the first detector input 312. Under the condition where the first switch 350 is closed (e.g., the windshield wipers are turned on by a user), the first capacitor 344 receives voltage from the battery 358, which charges the first capacitor 344. When a predetermined low priority polling time interval expires (as discussed in detail below), the first detection circuit 304 (including the first current source 316 and first detector 310) is activated for a predetermined scan time, referenced herein as "Tactive". Once activated, the first current source 316 attempts to dissipate any voltage stored on the first capacitor 344 by pulling any voltage across the first capacitor to ground. If the first switch 350 remains in a closed position, the voltage across the first capacitor 344 will remain high, as the battery will continue to charge the first capacitor 344. In contrast, if the first switch 350 is in an open position, any residual voltage that may have existed across the first capacitor 344 will be dissipated by the first current source 316. As the first capacitor 344 is connected to the first detector input 312, after the Tactive scan time expires, the voltage at the first detector input 312 substantially equals the voltage across the first capacitor 344. The voltage at the first detector input 312 is measured and compared, by the first detector 310, with a preselected first threshold voltage. If the voltage at the first detector input 312 equals or exceeds the first threshold voltage (including an error variance, for example +/−8%), then the first detector output 314 will be a digital high output (i.e., 1). In contrast, if the first detector input 312 is less than the first threshold voltage (including the error variance), then the first detector output 314 will be a digital low output (i.e., 0).

The first switch 350 was identified as a low priority switch, and therefore would not be checked as often as a switch identified with a higher priority. By comparison, the second switch 354 in the second switch circuit 356 is identified as a normal priority switch, as it is intended to be checked more frequently. The second switch 354 is shown as a normally-closed front door position switch that is configured to operate in a switch-to-ground circuit configuration. This type of configuration includes connecting the second switch 354 to ground at one end, and the other end to each of the second capacitor 346, the second current source 326, and the second detector input 322. When the second switch 354 is in a closed position (e.g., the vehicle front door is closed), any charge on the second capacitor 346 is dissipated to ground. In contrast, when the second switch 354 is in an open position (e.g., the vehicle front door is opened), current received by the second capacitor 346 will create a voltage potential across the second capacitor 346, which is not dissipated. When a predetermined normal polling time interval expires for normal priority switches, the second detection circuit 306 (including the second current source 326 and second detector 320) is activated for a Tactive scan time. Once activated, the second current source 326 passes current to the second capacitor 346 in an attempt to charge it. If the second switch 354 is in an open position, the voltage on the second capacitor 346 will increase as it is not being driven to ground by the second switch 354. As the second capacitor 346 is connected to the second detector input 322, after the Tactive scan time expires, the voltage at the second detector input 322 substantially equals the voltage across the second capacitor 346. The voltage at the second detector input 322 is compared with a preselected second threshold voltage by the second detector 320. If the voltage at the second detector input 322 equals or exceeds the second threshold voltage (including an error variance, for example +/−8%), indicating that the second switch 354 is open, then the second detector output 324 will be a digital high output (i.e., 1). In contrast, if the second detector input 322 is less than the second threshold voltage (including an error variance), indicating that the second switch 354 is closed, then the second detector output 324 will be a digital low output (i.e., 0).

The first switch 350 and second switch 354 were identified with low and normal priority for exemplary purposes, although in some cases an input to a detector circuit 204 can be identified as having a high priority. Further by comparison, the third detection circuit 308, for example, is connected to the sensor device 359 (e.g., a high priority sensor). The sensor device 359 and third capacitor 348 form the third switch circuit 360. The sensor device 359 can include one of various types of sensor devices, although in some embodiments, the sensor device 359 is configured to receive wireless transmission signals, such as radio frequency signals from a remote transmitter used to unlock a vehicle's doors. Upon receipt of a transmission from a remote transmitter, the sensor device 359 provides a voltage (e.g., 5 volts) to the third capacitor 348. As the sensor device 359 is identified as having a high priority, the third switch circuit 360 is continuously monitored by the interface control unit 214, and having no delay in sensing, therefore operating independent of the polling time interval. In addition, as the sensor device 359 provides its own source of current and the third switch circuit 360 is monitored for activity at all times, the third detection circuit 308 does not include a current source. In operation, the third detector 330 is always active and therefore checking the third detector input 332 and comparing it with the threshold voltage for the third detector 330. When a high signal from the third detector output 334 is received by the interface control unit 214, the interface control unit 214 initiates a wake command that is sent to the microcontroller unit 107 and/or power supply 108.

A particular advantage of the third detection circuit 308 is that the switch detection device 106 is configured to receive and respond to the sensor device 359 without the need for a non-integrated component residing on a separate IC.

The aforementioned description of the various types of switch circuits 111 and detection circuits 204 are intended to be exemplary of one configuration of some embodiments and should be understood to not be limiting to other embodiments. Further, although not discussed in detail, various other capacitors 362, resistors 364, and diodes 366 can also be provided on the module 105 to perform various routine functions, such as reverse current protection, etc.

As described above, the various detection circuits 204 utilize energy from the vehicle battery 358 while actively engaging the switch circuits 111 to check the status of the switches 102. This energy is expended primarily through the activation of the current sources 208 and detectors 206, and can be reduced by limiting such activation. One method of limiting activation is to exclude some detection circuits 204 from being activated during a lower power mode. Switches 102 connected to detection circuits 204 can be selected for continuous monitoring during normal power mode, but excluded completely from monitoring during low power mode. Another method of limiting such activation is to initiate a low power mode that utilizes multiple selectable polling time intervals (e.g., slow polling time interval and normal polling time interval). This provides for less frequent energization of detection circuits 204. More particularly, switch circuits 111 identified as having normal priority, such as the second switch circuit 356 associated with the second detection circuit 306, will be activated at the expiration of a normal polling time interval. In contrast, low priority switch circuits 111, such as the first switch circuit 352, would have their associated detection circuit activated only at the expiration of a slow polling time interval, which would be equal to a time greater than the normal polling time interval.

The polling time intervals for the switch detection device 106 can vary to accommodate specific applications. The switch detection device 106 can be programmed with a plurality of polling time intervals, ranging from slow (long time interval) to fast (short time interval). The polling time intervals can be stored in various registers 217 in a memory portion 218 (FIG. 2) of the interface control unit 214. In some embodiments, the switch detection device 106 includes a slow polling time interval and a normal polling time interval, although a fast polling time interval can also be provided. The normal polling time interval is used to activate the switches 102 in a vehicle that are often expected to change state when a vehicle is in a non-operational mode, such as the front door position switch 350, a trunk position switch, etc. The normal polling time interval can include, for example, 64 milliseconds (ms), although other time intervals ranging from microseconds to hundreds of milliseconds can be selected. In contrast, the slow polling time interval would be used to activate switches 102 identified as less likely to be activated when a vehicle is non-operational, such as the windshield wiper switch 352, the rear defroster switch, etc. The slow polling time interval can involve polling periods of, for example, 256 ms, although other time intervals, for example time intervals ranging from microseconds to hundreds of milliseconds, can be selected, with the understanding that the slow polling time interval will be greater than the normal polling time interval. As discussed in detail below with reference to FIG. 4, the switch detection device 106 is configured to monitor the internal clock 209 and at the expiration of the normal polling time interval, the switch detection device 106 energizes detection circuits 204 identified for normal polling, and at the expiration of the slow polling time interval, the switch detection device 106 energizes detection circuits 204 identified for slow polling.

Figure 4:
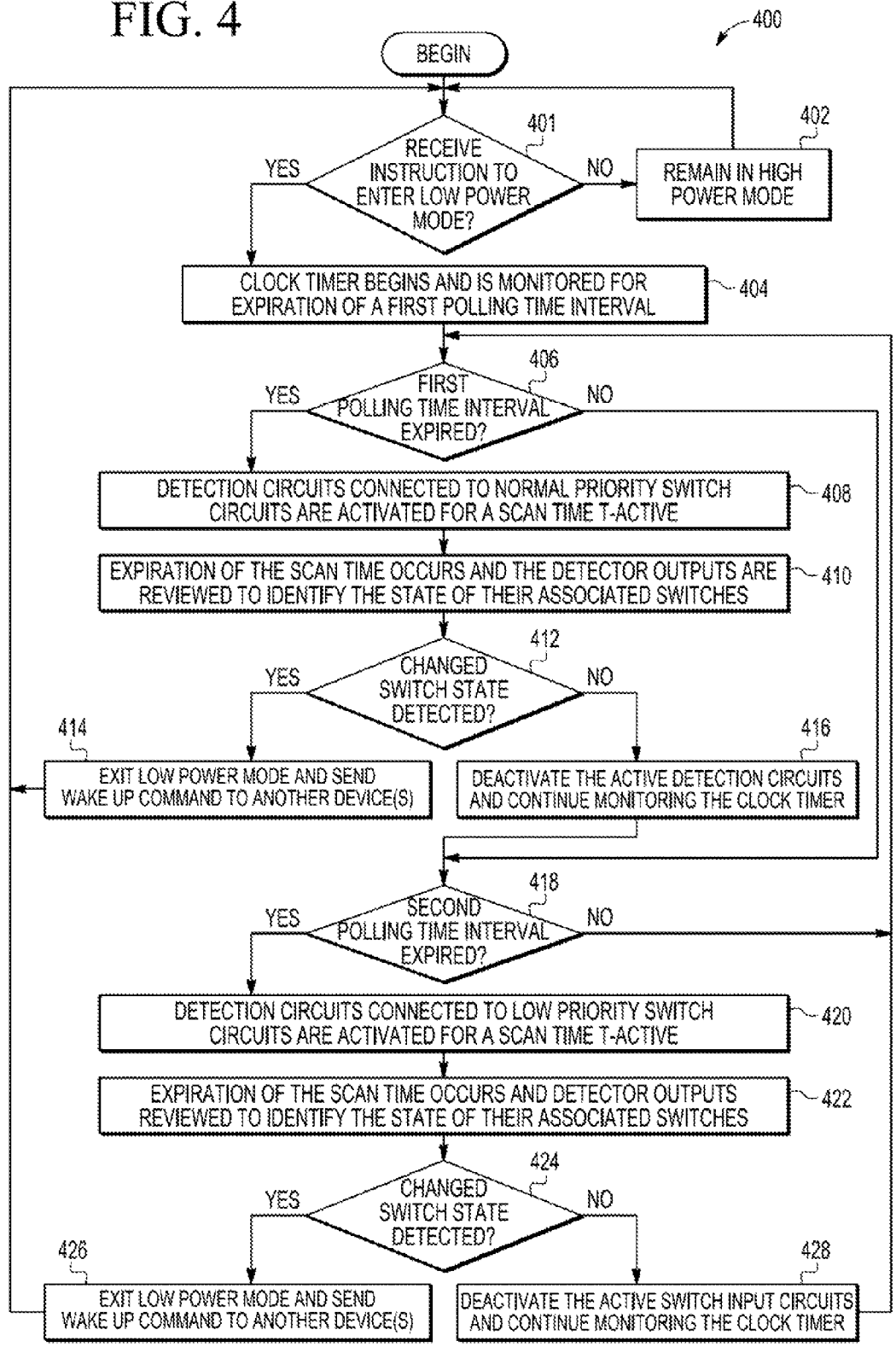
FIG. 4 is an exemplary flowchart that illustrates various exemplary steps of operating the switch detection device of FIG. 2.

Referring to FIG. 4, an exemplary flowchart 400 is provided that illustrates various exemplary steps of operating the switch detection device 106. The flowchart 400 includes the operation of the switch detection device 106 with both a first and a second polling time interval, which can provide significant energy savings by reducing the current used by the switch detection device 106 when in low power mode. Beginning at step 401, the switch detection device 106 queries if an instruction to enter low power mode has been received. This instruction can be received from one or more of numerous devices, such as the microcontroller unit 107. If a low power mode instruction has not been received, then the operation remains in high power mode, as shown at step 402. If an instruction to enter low power mode has been received, then the operation moves to step 404, where the clock 209 is started and the interface control unit 214 begins to monitor for the expiration of a first polling time interval. In some embodiments, the first polling time interval is the normal polling time interval, as discussed above, although other polling time intervals can be included, such as a fast polling time interval, which can include one of numerous values that are less than the preselected normal polling time interval. An exemplary fast polling time interval can range from about 10 μs to about 3 ms, although other time intervals, for example, those ranging from microseconds to hundreds of milliseconds, can be selected. The interface control unit 214 can monitor for fast, normal, and slow polling time intervals simultaneously.

Continuing with the operation, at step 406, if the first polling time interval (e.g., normal polling time interval) has not expired, the operation moves to step 418 to check if a second polling time interval (discussed below) has expired. If at step 406, the first polling time interval has expired, then the operation moves to step 408, wherein activation of the detection circuits 204 that have been preselected for monitoring at the first polling time interval occurs. The second detection circuit 306 has been identified with the first polling time interval, although it is to be understood that a plurality of detection circuits 204 can be identified with the first polling time interval, and therefore many detection circuits 204 can be simultaneously activated and evaluated similar to the second detection circuit 306 in the manner described below. Activation of the second detection circuit 306 includes activating the second current source 326 and the second detector 320 for a scan time Tactive. In some embodiments, Tactive includes a time that is determined sufficient to charge or to dissipate an accumulated charge, on associated capacitors (e.g., second capacitor 346), for example 55 μs, although other Tactive scan times can be utilized, as Tactive can vary depending on the capacitance of the switch circuits 111, the threshold voltages selected, and the selected current levels provided by the current sources 208. To calculate various parameters, the equation $I=C*(dV/dt)$ can be utilized. To solve for a suitable threshold voltage (dV) based on a given capacitance (C), a selected polling current (I) (current output from a current source), and a selected Tactive time (dt), the equation is rewritten as $dV=(I*dt)/C$. For example, if the second current source 326 provided a polling current of 1 mA, and the second capacitor 346 had a capacitance of 47 nanofarads (nF), and a Tactive time of 55 μs was selected, the threshold voltage utilized by the second detector 320 would be about 1.17 volts. This equation can be rewritten to solve for each of the parameters in a similar manner.

During Tactive, the second current source 326 provides a driving current to the second switch circuit 356, including the second capacitor 346 and the second switch 354. At step 410, when Tactive has expired, the voltage at the second detector input 322, provided by the second switch circuit 356, is examined by the second detector 320 and if the voltage meets or exceeds a preselected threshold voltage, then the second detector 320 provides a digital high (1) at the second detector output 324. The second detector output value is then passed to the interface control unit 214, where at step 412, the output value is compared with a stored value by the interface control unit 214. The stored value is obtained prior to the activation of the second detection circuit 306, and in at least some embodiments, is stored prior to the switch detection device 106 entering low power mode. If the output value from the second detector output 324 does not equal the stored value (i.e., changed from high to low or low to high), then the operation moves to step 414. At step 414, in response to the second switch 354 (or another first polling time interval identified switch 102) changing its state, the switch detection device 106 exits lower power mode and/or sends a wakeup command to the microcontroller unit 107, and the operation returns to step 401.

Returning to step 412, if the output value from the second detector output 324 equals the stored value (switch has not changed state), then the operation moves to step 416, where the second detection circuit 306 (and other active detection circuits 204 identified with the first polling time interval) is deactivated. The clock continues to monitor for the expiration of a subsequent polling time interval, which can include a second polling time interval, or a subsequent first polling time interval, as the first polling time interval can expire multiple times before the second polling time expires. For example, if the first polling time interval is 55 ms and the second polling time interval is 220 ms, then the first polling time interval will expire 4 times before the second polling time interval expires. Therefore, the second detection circuit 306 would be activated 4 times for each activation of the first detection circuit 304 At step 418, a second polling time interval (slow polling time interval for low priority switch circuits) expires. At step 420, the first detection circuit 304 (along with any other detection circuits 204 identified with the second polling time interval), is activated for a scan time Tactive (although other scan times can be utilized that differ from Tactive). At step 422, expiration of Tactive is detected and the voltage at the first detector input 312 (provided by the first switch circuit 352) is examined by the first detector 310. If the voltage meets or exceeds a preselected threshold voltage for the first detector 310, then the first detector 310 provides a digital high (1) at the first detector output 314. The first detector output value is then passed to the interface control unit 214, where at step 424 the output value is compared with a stored value. If the output value of the first detector 310 does not equal the stored value (i.e., changed from high to low or low to high), then the operation moves to step 426. It is to be understood that other detection circuits 204 associated with switch circuits 111 that are identified with the slow polling time interval, are activated, analyzed, and deactivated along with the first detection circuit 304. At step 426, in response to the first switch 350 (or another switch 102 identified with the second polling time interval) changing its state, the switch detection device 106 exits lower power mode and/or sends a wakeup command to another device, such as the microcontroller unit 107, and the operation returns to step 401. Returning to step 424, if the output value from the first detector output 314 equals the stored value, then the operation moves to step 428. At step 428, the first detection circuit 304 (and other active detection circuits 204 identified with the second polling time interval) is deactivated and the operation returns to step 406 to monitor for the expiration of subsequent polling time intervals. The clock is continuously monitored during low power mode to monitor for the expiration of the various polling time intervals, including a third polling time interval, if configured as such. In addition, the clock can be reset automatically upon reaching a polling time interval and a counter can be utilized to provide an indication that a second polling time interval has been achieved. Such a configuration typically involves the second polling time interval being a multiple of the first polling time interval, allowing the clock to count to the expiration of the first polling time interval and then trigger the counter and reset the clock. When the counter reaches the multiple of the first polling time interval that equals the second polling time interval, the second polling time interval is acknowledged as expired, and so forth for any additional polling time intervals.

Configuring the switch detection device 106 can be accomplished in numerous manners. In some embodiments, the switch detection device 106 is placed in communication with a user interface (not shown), which allows for a user to program the switch detection device 106 via the interface control unit 214. This can be accomplished before or after installation of the switch detection device 106 in the module 105. The user can enter the preselected values, such as the desired polling time intervals. In addition to selecting multiple selectable polling time intervals, various other preselected values can be entered by the user. More particularly, the switch detection device 106 further includes the ability to select a unique current value, from a range of values, for each current source 208. Each switch circuit 111 includes unique electrical characteristics, for example the capacitance of the capacitor 110 in a switch circuit can be very large or very small, and therefore, selection of a unique current value for each current source 208 can be advantageous in addressing large or small circuit discrepancies, while enhancing energy savings. For example, absent the ability to select unique current values, the switch detection device 106 would need to compensate for a large capacitor 110 in a switch circuit 111 by either providing a sufficiently large current to all the switch circuits 111 (to accommodate the largest capacitance), or by increasing the Tactive scan time to allow for a larger capacitor to charge completely. Either one of these options would consume additional energy. Further, in some embodiments, the range of current values available for the current sources 208 includes about 1 mA to about 6 mA, although other ranges can be provided, for example from about 1 mA to about 20 mA.

With regard to selectable current values, polling times, and threshold voltages, a user can preselect these values. In at least one embodiment, the switch detection device 106 is installed into the module 105 and the microcontroller unit 107 of the module 105 is connected to a user interface (not shown) (e.g., a computer) configured to communicate with the microcontroller unit 107. To preselect values, a user accesses the microcontroller unit 107 with the user interface and inputs the desired current values, polling time intervals, and threshold voltages. The microcontroller unit 107 then communicates, via SPI protocol, a message to the interface control unit 214 of the switch detection device 106. For current values, the internal logic of the interface control unit 214 decodes the message and commands each current source 208 to change their output level to match the selected value. The command to each current source 208 includes modifying a reference current that each current source 208 uses to determine their output. With regard to the polling time intervals and threshold voltages, these values can be stored in the various registers 217 in the memory portion 218 of the interface control unit 214 for access during the various operations. The threshold voltages are then available for access by the detectors 206 for comparing with the values measured at the detector inputs 210.

Further energy savings and enhanced control can be provided through the configuration of unique threshold voltages for each detector 206. In some embodiments, such threshold voltages are also programmed into the switch detection device 106 by the user. Similar to the customizable current sources 208, the detectors 206 for each detection circuit 204 can also be configured to suit the characteristics of associated switch circuits 111, by selecting a unique threshold voltage. More particularly, during operation, the switch circuits 111 and detection circuits 204 are exposed to various levels of internal and external electrical noise (i.e., unwanted electrical signals received from nearby devices or wires, random fluctuations in electrical signals to a device, etc.). When the switch detection device 106 is installed in a vehicle, for example, vehicle chassis wiring can impart high inductance voltage spikes onto nearby wiring forming part of the switch circuits 111. To provide noise immunity, the threshold voltage for each detector 206 is set high enough to substantially limit or prevent electrical noise from triggering a false high indication at the output of the detectors 206, resulting in the switch detection device 106 exiting low power mode and resuming normal power mode. Absent the configurability of unique threshold values, the flexibility to use various components associated with the device 100, such as specific switches and capacitors, can be limited, limiting the ability to accommodate some applications for switch detection device 106. In some embodiments, the threshold voltages for the detectors 206 are selectable from a range of threshold voltages, for example, from about 0.2 volts to about 0.8 volts, while in other embodiments, threshold voltages can range from about 3.0 volts to about 5.0 volts, while in yet other embodiments, the threshold voltages can include other ranges.

It is noted that various parameters and operations have been described herein as pre-selected. It should be understood that such pre-selections can occur during programming of the switch detection device 106 by a user, as discussed above, or during the manufacturing of the switch detection device 106. The switch detection device 106 is often incorporated with a module, such as the module 105, and then configured for use in a specific vehicle, with the vehicle having specific parameters that are to be accommodated. The various advantageous features described above provide flexibility to adapt the switch detection device 106 to accommodate a vast array of vehicle systems. In addition, the switch detection device 106 can be used in various types of vehicles, such as a motor vehicle, although it should be understood that the switch detection device 106 is not limited in its applicability, and can be suitable for various other applications where the detection of switches is advantageous.

It should be appreciated that the present disclosure is intended to encompass numerous embodiments as disclosed herein and further described by the following:

(i). A method of switch detection comprising:

enabling a low power mode on a switch detection device;

activating a first detection circuit for detecting, at a first expiration of a first polling time interval, a first switch state of a first switch having a first priority level, wherein the first switch state includes one of a first open state and a first closed state;

comparing the detected first switch state with a prior first switch state;

activating a second detection circuit for detecting, at a second expiration of a second polling time interval, a second switch state of a second switch having a second priority level, wherein the second switch includes one of a second open state and a second closed state, wherein the second polling time interval is greater than the first polling time interval, and the second priority level is different from the first priority level;
  comparing the detected second switch state with a prior second switch state; and
  outputting a wake signal if at least one of the detected first switch state and detected second switch state differs from its respective prior switch state.

(ii). The method of (i), wherein activating the first detection circuit includes activating a first current source to provide a first current to a first switch circuit, wherein the first switch circuit is in communication with the first switch; and wherein activating the second detection circuit includes activating a second current source to provide a second current to a second switch circuit, wherein the second switch circuit is in communication with the second switch.

(iii). The method of any one of (i)-(ii), wherein activating the first detection circuit includes activating a first detector, associated with the first switch circuit, to measure a first voltage received at a first detector input, wherein the first voltage is received from the first switch circuit; and wherein activating the second detection circuit includes activating a second detector, associated with the second switch circuit, to measure a second voltage received at a second detector input, wherein the second voltage is received from the second switch circuit.

(iv). The method of any one of (i)-(iii), wherein the detecting of the first switch state includes detecting if the first voltage measured at the first detector input has reached a preselected first threshold voltage and providing a first signal at a first detector output if the preselected first threshold voltage is reached and a second signal at the first detector output if the preselected first threshold voltage is not reached; and wherein the detecting of the second switch state includes detecting if the second voltage measured at the second detector input has reached a preselected second threshold voltage and providing a first signal at a second detector output if the preselected second threshold voltage is reached and a second signal at the second detector output if the preselected second threshold voltage is not reached.

(v). The method of any one of (i)-(iv), wherein comparing the detected first switch state with the prior first switch state includes receiving a first detector output at an interface control unit and comparing the first detector output with the prior first switch state stored in a first register in the interface control unit; and wherein comparing the detected second switch state with the prior second switch state includes receiving a second detector output at an interface control unit and comparing the second detector output with the prior second switch state stored in a second register in the interface control unit.

(vi). The method of any one of (i)-(v), wherein the first threshold voltage was selected from a plurality of configurable threshold voltages and the second threshold voltage was selected from at least one of the plurality of configurable threshold voltages and an additional plurality of configurable threshold voltages, and wherein the selected second threshold voltage is not equal to the selected first threshold voltage.

(vii). The method of any one of (i)-(vi), further including deactivating the first detection circuit after comparing the detected first switch state with a prior first switch state; and deactivating the second detection circuit after comparing the detected second switch state with a prior second switch state.

(viii). The method of any one of (i)-(vii), further including:
  activating a third detection circuit for detecting, at a third expiration of a third polling time interval, a third switch state of a third switch having a third priority level, wherein the third switch state includes one of a third open state and a third closed state.

(ix). The method of any one of (i)-(viii), further including:
  activating a third detector associated with the third switch circuit, to monitor a third voltage detected at a third detector input, wherein the third voltage is received from the third switch circuit;
  providing a determination of the third switch state by detecting if the third voltage at the third detector input is below a third threshold voltage;
  comparing the detected third switch state with a prior third switch state; and
  outputting a wake signal if the third switch state has changed.

(x). A switch detection device comprising:
  a clock, configured to be monitored for a plurality of polling time intervals including a first polling time interval and a second polling time interval;
  a first detection circuit configured for interconnection with a first switch and for detecting a first switch state that includes one of an open state or a closed state;
  a second detection circuit configured for interconnection with a second switch and for detecting a second switch state that includes one of an open state or a closed state; and
  an interface control unit in communication with the first detection circuit and second detection circuit, for activating the first detection circuit at the expiration of the first polling time interval, and for activating the second detection circuit at the expiration of the second polling time interval.

(xi). The device of (x), wherein the interface control unit is configured to receive and compare the detected first switch state with a stored prior first switch state, and wherein the interface control unit is configured to receive and compare the detected second switch state with a stored prior second switch state.

(xii). The device of any one of (x)-(xi), further including an output port configured to provide an external wake signal if at least one of the first switch state and second switch state is determined to differ from its respective prior switch state.

(xiii). The device of any one of (x)-(xii), wherein the first detection circuit further includes a first detector in communication with a first current source and configurable to compare a first measured voltage receivable at a first detector input with a first threshold voltage and output the first switch state at a first detector output; and wherein the second detection circuit further includes a second detector in communication with a second current source and configurable to compare a second measured voltage receivable at a second detector input with a second threshold voltage and output a second value at a second detector output.

(xiv). The device of any one of (x)-(xiii), wherein the first and second threshold voltages are selectable from a range of threshold voltages and wherein the second threshold voltage is not equal to the first threshold voltage.

(xv). The device of any one of (x)-(xiv), wherein the second current source is configurable to output a chosen second current value selectable from a range of current values, and wherein the second current value is not equal to a first current value outputted by the first current source.

(xvi). The device of any one of (x)-(xv), further including a third detection circuit having a third detector in communication with a third switch circuit and configurable to compare a third measured voltage receivable at a third detector input with a third threshold voltage selectable from a range of threshold voltages, and output a third value at a third detector output for comparison with a third stored value, and wherein the third detector remains active to continuously monitor the third detector input, independent of the first and second polling time intervals.

(xvii). A switch detection system comprising:
an interface control unit operatable in a normal power mode and a low power mode;
a clock, configured to be monitored during low power mode for a plurality of polling time intervals, including at least a first polling time interval and a second polling time interval;
a first detection circuit configured for detecting the open or closed state of a first switch, wherein the first detection circuit is activated for a first time period at the expiration of the first polling time interval;
a second detection circuit configured for detecting the open or closed state of a second switch, wherein the second detection circuit is activated for a second time period at the expiration of the second polling time interval, wherein the second polling time interval is greater than the first polling time interval;
a plurality of capacitors, including at least a first capacitor in communication with the first detection circuit and a second capacitor in communication with the second detection circuit, wherein the first capacitor is configured for coupling with the first switch, and the second capacitor is configured for coupling with the second switch; and
a microcontroller unit in communication with the interface control unit and a power supply,
wherein the interface control unit is configured to compare the detected open or closed state of the first switch and second switch with prior open or closed switch states, and provide a wake command to at least one of the microcontroller unit and the power supply upon detection of a change in state of the first switch or second switch.

(xviii). The system of (xvii), wherein the first detection circuit includes a first current source and a first detector, and the second detection circuit includes a second current source and a second detector.

(xix). The system of any one of (xvii)-(xviii), wherein the first detector is configured to compare a first measured voltage receivable at a first detector input of the first detector with a first threshold voltage to determine the open or closed state of the first switch; and wherein the second detector is configured to compare a second measured voltage receivable at a second detector input of the second detector with a second threshold voltage that is not equal to the first threshold voltage, to determine the open or closed state of the second switch.

(xx). The system of any one of (xvii)-(xix), further including a third detection circuit having a third detector that remains continuously activated, and is configured to receive a signal from a sensing device, wherein the received signal includes a self-generated current While the principles of the switch detection device and method of use have been described above in connection with regard to a specific apparatus, it is to be clearly understood that this description is made only by way of example and not as a limitation on the scope of the switch detection device and method of use. It is specifically intended that the switch detection device and method of use not be limited to the embodiments and illustrations contained herein, but include modified forms of those embodiments including portions of the embodiments and combinations of elements of different embodiments as come within the scope of the following claims. In addition, the various methods of use described herein can include additional steps not described herein or can omit steps described herein. Further, the various steps can be performed in a different order than described herein.

What is claimed is:

1. A method of switch for saving electrical power, the method comprising:
    enabling a low power mode on a switch detection device;
    activating a first detection circuit for detecting a first switch state of a first switch having a first priority level, defined by a first polling time interval, wherein the detecting of the first switch state is performed at a first expiration of the first polling time interval, and wherein the first switch state includes one of a first open state and a first closed state;
    comparing the detected first switch state with a prior first switch state;
    activating a second detection circuit for detecting a second switch state of a second switch having a second priority level defined by a second polling time interval, wherein the detecting of the second switch state is performed at a second expiration of the second polling time interval, wherein the second switch includes one of a second open state and a second closed state, wherein the second polling time interval is greater than the first polling time interval to save electrical power;
    comparing the detected second switch state with a prior second switch state; and
    outputting a wake signal if at least one of the detected first switch state and detected second switch state differs from its respective prior switch state.

2. The method of claim 1, wherein activating the first detection circuit includes activating a first current source to provide a first current to a first switch circuit, wherein the first switch circuit is in communication with the first switch; wherein activating the second detection circuit includes activating a second current source to provide a second current to a second switch circuit, wherein the second switch circuit is in communication with the second switch; wherein the first switch is configured to change states when a vehicle is in a non-operational mode, and wherein the second switch is less likely than the first switch to change states when the vehicle is in the non-operational mode.

3. The method of claim 2, wherein activating the first detection circuit includes activating a first detector, associated with the first switch circuit, to measure a first voltage received at a first detector input, wherein the first voltage is received from the first switch circuit; and wherein activating the second detection circuit includes activating a second detector, associated with the second switch circuit, to measure a second voltage received at a second detector input, wherein the second voltage is received from the second switch circuit.

4. The method of claim 3, wherein the detecting of the first switch state includes detecting if the first voltage measured at the first detector input has reached a preselected first threshold voltage and providing a first signal at a first detector output if the preselected first threshold voltage is reached and a second signal at the first detector output if the preselected first threshold voltage is not reached; and wherein the detecting of the second switch state includes detecting if the second voltage measured at the second detector input has reached a preselected second threshold voltage and providing a first signal at a second detector output if the preselected second threshold voltage is reached and a second signal at the second detector output if the preselected second threshold voltage is not reached.

5. The method of claim 4, wherein the first threshold voltage was selected from a plurality of configurable threshold voltages and the second threshold voltage was selected from at least one of the plurality of configurable threshold voltages and an additional plurality of configurable threshold voltages, and wherein the selected second threshold voltage is not equal to the selected first threshold voltage.

6. The method of claim 3, wherein comparing the detected first switch state with the prior first switch state includes receiving a first detector output at an interface control unit and comparing the first detector output with the prior first switch state stored in a first register in the interface control unit; and wherein comparing the detected second switch state with the prior second switch state includes receiving a second detector output at an interface control unit and comparing the second detector output with the prior second switch state stored in a second register in the interface control unit.

7. The method of claim 1, further including deactivating the first detection circuit after comparing the detected first switch state with a prior first switch state; and deactivating the second detection circuit after comparing the detected second switch state with a prior second switch state.

8. The method of claim 1, further including:
activating a third detection circuit for detecting, at a third expiration of a third polling time interval, a third switch state of a third switch having a third priority level, wherein the third switch state includes one of a third open state and a third closed state.

9. The method of claim 8, further including:
activating a third detector associated with the third switch circuit, to monitor a third voltage detected at a third detector input, wherein the third voltage is received from the third switch circuit;
providing a determination of the third switch state by detecting if the third voltage at the third detector input is below a third threshold voltage;
comparing the detected third switch state with a prior third switch state; and
outputting a wake signal if the third switch state has changed.

10. A switch detection device for saving electrical power, the device comprising:
a clock, configured to be monitored for a plurality of polling time intervals including a first polling time interval defining a first priority level and a second polling time interval defining a second priority level, wherein the second polling time interval is greater than the first polling time interval for saving electrical power;
a first detection circuit configured for interconnection with a first switch and for detecting a first switch state that includes one of an open state or a closed state;
a second detection circuit configured for interconnection with a second switch and for detecting a second switch state that includes one of an open state or a closed state; and
an interface control unit in communication with the first detection circuit and second detection circuit, for activating the first detection circuit at the expiration of the first polling time interval, and for activating the second detection circuit at the expiration of the second polling time interval.

11. The device of claim 10, wherein the interface control unit is configured to receive and compare the detected first switch state with a stored prior first switch state, wherein the interface control unit is configured to receive and compare the detected second switch state with a stored prior second switch state, wherein the first switch is configured to change states when a vehicle is in a non-operational mode, and wherein the second switch is less likely than the first switch to change states when the vehicle is in the non-operational mode.

12. The device of claim 11, further including an output port configured to provide an external wake signal if at least one of the first switch state and second switch state is determined to differ from its respective prior switch state.

13. The device of claim 11, further including a third detection circuit having a third detector in communication with a third switch circuit and configurable to compare a third measured voltage receivable at a third detector input with a third threshold voltage selectable from a range of threshold voltages, and output a third value at a third detector output for comparison with a third stored value, and wherein the third detector remains active to continuously monitor the third detector input, independent of the first and second polling time intervals.

14. The device of claim 10, wherein the first detection circuit further includes a first detector in communication with a first current source and configurable to compare a first measured voltage receivable at a first detector input with a first threshold voltage and output the first switch state at a first detector output; and wherein the second detection circuit further includes a second detector in communication with a second current source and configurable to compare a second measured voltage receivable at a second detector input with a second threshold voltage and output a second value at a second detector output.

15. The device of claim 14, wherein the first and second threshold voltages are selectable from a range of threshold voltages and wherein the second threshold voltage is not equal to the first threshold voltage.

16. The device of claim 14, wherein the second current source is configurable to output a chosen second current value selectable from a range of current values, and wherein the second current value is not equal to a first current value outputted by the first current source.

17. A switch detection system for saving electrical power, the system comprising:
an interface control unit operable in a normal power mode and a low power mode;
a clock, configured to be monitored during low power mode for a plurality of polling time intervals, including at least a first polling time interval defining a first priority level and a second polling time interval defining a second priority level;
a first detection circuit configured for detecting the open or closed state of a first switch, wherein the first detection circuit is activated for a first time period at the expiration of the first polling time interval;
a second detection circuit configured for detecting the open or closed state of a second switch, wherein the second detection circuit is activated for a second time period at the expiration of the second polling time interval, wherein the second polling time interval is greater than the first polling time interval to save electrical power;
a plurality of capacitors, including at least a first capacitor in communication with the first detection circuit and a second capacitor in communication with the second detection circuit, wherein the first capacitor is configured for coupling with the first switch, and the second capacitor is configured for coupling with the second switch; and a microcontroller unit in communication with the interface control unit and a power supply, wherein the interface control unit is configured to compare the detected open or closed state of the first switch and second switch with prior open or closed switch states, and provide a wake command to at least one of the microcontroller unit and the power supply upon detection of a change in state of the first switch or second switch.

18. The system of claim 17, wherein the first detection circuit includes a first current source and a first detector, and the second detection circuit includes a second current source and a second detector; wherein the first switch may change states when a vehicle is in a non-operational mode, and wherein the second switch that is less likely than the first switch to change states when the vehicle is in the non-operational mode.

19. The system of claim 18, wherein the first detector is configured to compare a first measured voltage receivable at a first detector input of the first detector with a first threshold voltage to determine the open or closed state of the first switch; and wherein the second detector is configured to compare a second measured voltage receivable at a second detector input of the second detector with a second threshold voltage that is not equal to the first threshold voltage, to determine the open or closed state of the second switch.

20. The system of claim 18, further including a third detection circuit having a third detector that remains continuously activated, and is configured to receive a signal from a sensing device, wherein the received signal includes a self-generated current.

* * * * *